United States Patent

[11] 3,596,207

[72] Inventor Hiroaki Nabeyama
Higashikoganei-shi, Japan

[21] Appl No 6,220
[22] Filed Jan. 27, 1970
[45] Patented July 27, 1971
[73] Assignee Hitachi, Ltd.
Tokyo, Japan
[32] Priority Feb. 15, 1969
[33] Japan
[31] 44/11236

[54] VOLTAGE CONTROL OSCILLATOR
3 Claims, 5 Drawing Figs.

[52] U.S. Cl. .... 331/117 R, 332/16 T
[51] Int. Cl. .... H03b 5/12
[50] Field of Search .... 331/117, 8; 332/16

[56] References Cited
UNITED STATES PATENTS

| | | | |
|---|---|---|---|
| 3,205,452 | 9/1965 | Saudinaitis | 331/8 |
| 3,473,080 | 10/1969 | Massman | 331/117 |

*Primary Examiner*—John Kominski
*Attorney*—Craig, Antonelli, Stewart and Hill

ABSTRACT: A voltage control oscillator adapted so that the oscillation frequency thereof can be controlled by use of a variable DC voltage, wherein a signal is positively fed from the emitter of a transistor constituting the oscillator back to the base thereof through a transformer and capacitor, a diode connected to said capacitor, and the aforementioned variable DC voltage is imparted to said transformer through said diode, thereby controlling the nonconducting period of said transistor.

INVENTOR

HIROAKI NABEYAMA

BY Craig, Antonelli, Stewart & Hill
ATTORNEYS

PATENTED JUL 27 1971 3,596,207

SHEET 2 OF 2

INVENTOR

HIROAKI NABEYAMA

BY Craig, Antonelli, Stewart & Hill

ATTORNEYS

VOLTAGE CONTROL OSCILLATOR

BACKGROUND OF THE INVENTION

1. Field of the Invention

This invention relates to an oscillator designed so that the oscillation frequency thereof is controlled in accordance with a change in a DC control voltage, and more particularly it pertains to a voltage control oscillator which is so designed that the output pulse width remains unchanged irrespective of any change in the aforementioned control voltage.

2. Description of the Prior Art

A voltage control oscillator has been used for an automatic frequency control circuit (AFC circuit) such as, for example, the horizontal AFC circuit of a television receiver. It is often the case that such an oscillator is constituted by a Hartley oscillator. As is well known in the art, with this type of oscillator, the oscillation frequency thereof is not substantially varied due to a voltage variation, temperature variation, and/or "irregularities" of the circuit element constants. Disadvantageously, however, not only the oscillation frequency, but also the output pulse width tends to be changed by changing the control voltage in an attempt to control the oscillation frequency (control it to a predetermined value). Therefore, if such a voltage control oscillator is employed in the horizontal AFC circuit of a television receiver for example, then there will be such a tendency that the driving power to be supplied to a drive transformer connected with the output terminals of the voltage control oscillator is changed so that the base current of a power transistor connected therewith is also changed. The result will be such that the aforementioned power transistor becomes either over-saturated or insufficiently excited. This will constitute a cause for damage to the power transistor or power loss.

SUMMARY OF THE INVENTION

It is an object of the present invention to provide a voltage control oscillator which is so designed that the output pulse width can be kept substantially constant irrespective of any variation in the input control voltage.

The foregoing object of the present invention can be accomplished in a voltage control oscillator comprising a transistor, means for imparting an operating voltage to the collector and base of said transistor, a DC blocking capacitor connected to the base of said transistor, a transformer connected between the emitter of said transistor and said capacitor for causing a signal to be positively fed from the emitter of said transistor back to the base thereof, and a diode having one of the ends thereof provided with an output terminal to which a frequency control signal is imparted and the other end connected to said transformer, said diode being adapted to be rendered nonconductive when said transistor is rendered conductive.

Other objects, features and advantages of the present invention will become apparent from the foregoing description taken in conjunction with the accompanying drawings.

DESCRIPTION OF THE PREFERRED EMBODIMENTS

Figure 1:
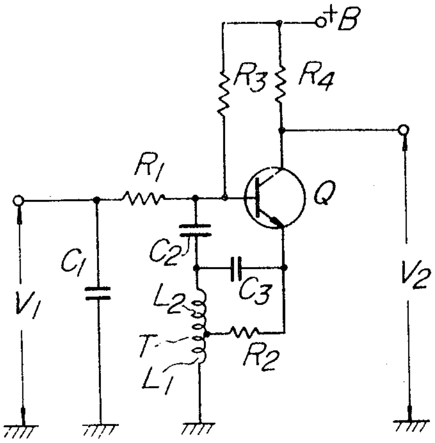
FIG. 1 PRIOR ART
FIG. 1 is a circuit diagram showing an example of the conventional voltage control oscillators.

With reference to FIG. 1, description will first be made of the conventional circuit, wherein an oscillation frequency control voltage (DC voltage) is applied to the base of a transistor Q through a filter circuit formed by a capacitor $C_1$ and resistor $R_1$. The emitter of the transistor Q is connected to the base thereof through a resistor $R_2$, secondary winding $L_2$ of a transformer T and a DC current blocking capacitor $C_2$ so that a signal may be positively fed from the emitter of the transistor Q back to the base thereof, thus resulting in an oscillation. Further, the emitter of the transistor Q is grounded through the resistor $R_2$ and primary winding $L_1$ of the transformer T. Capacitor $C_3$ serves as a bypass capacitor through which energy stored at the transformer T is discharged. An output voltage $V_2$ is taken from the collector of the transistor Q to which a voltage +B is imparted through a load resistor $R_4$. A bias voltage is applied to the base of the transistor Q through a resistor $R_3$.

In operation, the transistor Q is rendered conductive when a predetermined voltage is applied to the base thereof, so that there flows an emitter current. The transformer T takes the form of a so-called auto-transformer wherein a voltage induced in the second winding $L_2$ thereof builds up as a current flowing through the primary winding thereof increases. Therefore, the base potential becomes higher and higher as the emitter current increases. In turn, this is reflected in an increase of the emitter current per se. Thus, the transistor Q is finally saturated. The saturation of the transistor Q causes the base current to be substantially linearly decreased so that the emitter current begins decreasing. Thus, the base potential becomes lower and lower under the action of the autotransformer, resulting in the transistor Q being rendered nonconductive. Thereafter, the energy stored at the transformer T is discharged through the capacitor $C_3$ and resistor $R_2$. In this way, one cycle of the operation is completed. The oscillation frequency of this conventional oscillator depends upon a resonance frequency determined from the capacitance of the capacitor $C_3$ and inductance of the secondary winding $L_2$, the time constant defined by the capacitor $C_2$ and resistor $R_3$ and the base potential of the transistor Q.

Figure 2:
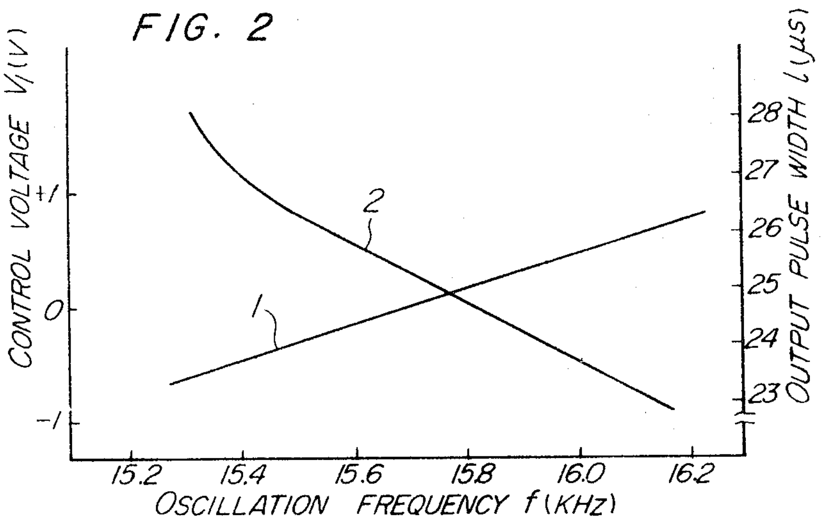
FIG. 2 is a view showing the operational characteristics of the circuit shown in FIG. 1.

With the foregoing oscillator, changing the control voltage $V_1$ to control the oscillation frequency causes the base current to be varied when the transistor Q assumes the "ON" state, so that the output pulse width ($\mu s$) is greatly changed as shown in FIG. 2. In FIG. 2, the straight line 1 represents the magnitude of the necessary control voltage $V_1$ for always producing an oscillation frequency of 15.75 kHz. which corresponds to the television horizontal scanning frequency for example, when the oscillation frequency of the oscillator is varied. The curve 2 shows variations in the output pulse width $l$ ($\mu s$) when the control voltage $V_1$ is applied to the base of the transistor Q. The circuit constants are as follows:

$R_1$=5.6 KΩ   $C_1$=0.1 μF
$R_2$=27 Ω   $C_2$=0.01 μF
$R_3$=47 Ω   $C_3$=0.068 μF
$R_4$=680 Ω

The turn ratio of the primary winding $L_1$ to the secondary winding $L_2$ of the transformer T is $L_1/L_2$=337/450.

Figure 3:
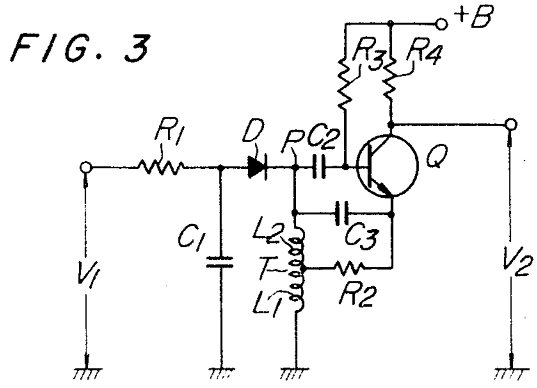
FIG. 3 is a circuit diagram showing an embodiment of the present invention.

Referring now to FIG. 3, there is shown a first embodiment of the present invention. Parts of FIG. 3 corresponding to those of FIG. 1 are indicated by like reference symbols. The circuit of FIG. 3 is differentiated from that of FIG. 1 in that there is provided a diode D having the anode thereof connected to the resistor $R_1$ and the cathode thereof coupled to the connection point *P* between the secondary winding $L_2$ of the transformer T and the capacitor $C_2$.

In operation, when the transistor Q is rendered conductive, an emitter current flows therethrough so that the current is caused to flow through the primary winding $L_1$ of the transformer T. As the emitter current increases gradually, the voltage across the secondary winding $L_2$ builds up gradually under the action of the auto-transformer. Thus, the potential at the point *P* increases so that the diode *D* is rendered nonconductive. The increase of the potential at the point *P* is in turn reflected in an increase of the base bias voltage whereby the emitter current of the transistor is gradually increased. The result is that the transistor Q is finally saturated. The saturation of the transistor Q causes the base current to be substantially linearly decreased so that the emitter current begins decreasing. At this point, the base potential becomes lower and lower under the action of the auto-transformer. Thus, the transistor Q is rendered nonconductive, whereas the diode is rendered conductive. After the transistor Q has been turned off, energy stored at the transformer is discharged. It is to be noted here that the energy discharge is controlled by the fact that the capacitor $C_1$ which has been charged at the control voltage $V_1$ is connected to the transformer T through the diode *D* and a series resonance circuit is constituted by the capacitance of the capacitor $C_1$ and the inductance of the transformer T. As a result, the nonconducting period of the transistor Q is controlled.

Due to variations in the characteristics of the elements constituting the oscillator, a variation in the power voltage or the like, both the conducting period and nonconducting period of the transistor Q tend to be varied so that the oscillation frequency is changed. Since the conducting period of the transistor Q (it constitutes a factor for determining the output pulse width *l*) is very short as compared with the nonconducting period. Therefore, the variation of the conducting period, that is, the variation of the pulse width *l* is very small as compared with the variation of the nonconducting period. Thus, by controlling the nonconducting period of the transistor Q, it is possible to maintain the oscillation frequency of the oscillator constant.

Since the diode *D* is rendered nonconductive when the transistor Q is rendered conductive as described above, the control voltage $V_1$ has no effect upon the pulse width *l* of the oscillation frequency. Thus, the base current of the transistor Q remains substantially unchanged so that the output pulse width *l* is maintained substantially constant. When the transistor Q is rendered nonconductive, on the other hand, the diode *D* is rendered conductive so that the nonconducting period of the transistor Q is controlled by the control voltage $V_1$. In this way, the oscillation frequency is always kept constant.

Figure 4:
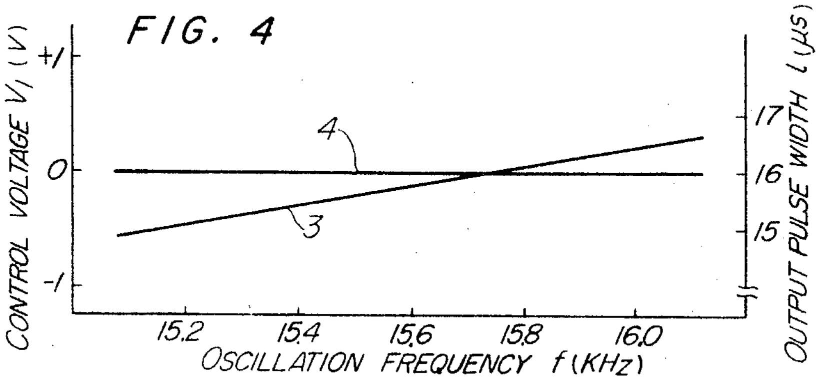
FIG. 4 is a view showing the operational characteristics of the circuit shown in FIG. 3.

FIG. 4 illustrates the characteristics of the circuit shown in FIG. 3, wherein the straight line 3 shows the magnitude of the control voltage $V_1$(V) required to always produce an oscillation frequency of 15.75 kHz. when the oscillation frequency of the oscillator is changed, and the straight line 4 represents the output pulse width *l* ($\mu$s) when the control voltage $V_1$ is applied to the oscillator. As will be seen from this figure, the output pulse width *l* remains substantially unchanged, even if the control voltage $V_1$ is changed in order to compensate a variation of the oscillation frequency.

Figure 5:
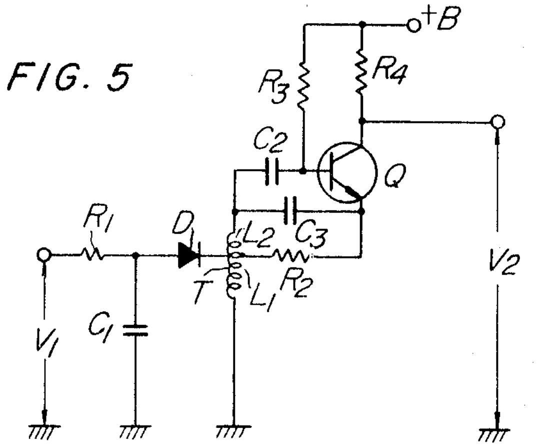
FIG. 5 is a circuit diagram showing a second embodiment of the present invention.

Referring now to FIG. 5, there is shown a second embodiment of the present invention wherein the diode *D* is connected to the center tap of the transformer T instead of being connected to the end of the secondary winding $L_2$ of the transformer T as in FIG. 3. Parts of FIG. 5 corresponding to those of FIG. 3 are indicated by like reference symbols.

When the transistor Q is rendered conductive, the diode *D* is turned off, and therefore the circuit arrangement of FIG. 5 exactly corresponds to that of FIG. 3. On the other hand, when the transistor Q is rendered nonconductive, the capacitor $C_1$ is connected to the primary winding $L_1$ of the transformer T through the diode D. Thus, in this embodiment, energy stored at the transformer T is controlled by a series resonance circuit constituted by the capacitor $C_1$ charged at the voltage $V_1$ and inductance of the primary winding $L_1$ of the transformer T, as opposed to the FIG. 3 circuit arrangement wherein energy stored at the transformer T is controlled by the series resonance circuit constituted by the capacitor $C_1$ charged at the voltage $V_1$ and a combined inductance represented by both the primary winding $L_1$ and secondary winding $L_2$ of the transformer T. Although there is a slight difference in the amount of the inductance constituting the resonance circuit between the two circuits, no substantial difference exists therebetween from the operational standpoint. That is, the circuit of FIG. 5 operates in the same manner as that of FIG. 3. Therefore, a detailed description of the operation of the FIG. 5 circuit arrangement will be omitted.

Although in the foregoing, description has been made on the assumption that the transistor Q is of the NPN type, it is also possible to employ a PNP-type transistor as the transistor Q by considering the polarity of a voltage imparted thereto.

I claim:

1. A voltage control oscillator comprising:
an oscillation transistor;
a DC cutoff capacitor connected to the base of said transistor;
a positive feedback transformer connected between the emitter of said transistor and said capacitor for positively feeding back to the base of said transistor a signal supplied thereto from the emitter of said transistor;
a diode connected to said transformer in such a direction as to be backwardly biased when said transistor is conductive condition;
means for applying a variable DC voltage to said diode for rendering said diode in conductive condition when said transistor is nonconductive condition; (controlling oscillation frequency;
means for supply DC operative voltage to said transistor for activation; and
an output terminal connected to the collector of said transistor, so that an oscillation output is derived out therefrom.

2. A voltage control oscillator according to claim 1, wherein said transformer has an intermediate tap and said diode is connected to said tap.

3. A voltage control oscillator comprising:
an oscillation transistor;
a DC cutoff capacitor connected at one end thereof to the base of said transistor;
a positive feedback transformer having a first winding coupled to the emitter of said transistor and a second winding coupled to said first winding and connected to the other one end of said capacitor for positively feeding back a signal derived from the emitter to the base of said transistor;
control means including a source of a variable DC voltage;
a diode connected between said control means and the junction between the second winding of said transformer and the other one end of said capacitor, in such a direction as to be backwardly biased by a potential at the junction when said transistor is in conductive condition but forwardly biased by said DC voltage when said transistor is in nonconductive condition;
source means for operatingly supplying DC operative bias voltages to said transistor; and
an output terminal provided to the collector of said transistor, so that an oscillated output is derived out therefrom.